(12) United States Patent
Luong et al.

(10) Patent No.: US 9,912,320 B2
(45) Date of Patent: Mar. 6, 2018

(54) EXPONENTIALLY SCALING SWITCHED CAPACITOR

(71) Applicant: The Hong Kong University of Science and Technology, Hong Kong (CN)

(72) Inventors: Howard Cam Luong, Hong Kong (CN); Zhiqiang Huang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 101 days.

(21) Appl. No.: 15/180,442

(22) Filed: Jun. 13, 2016

(65) Prior Publication Data

US 2017/0359052 A1 Dec. 14, 2017

(51) Int. Cl.
| | | |
|---|---|---|
| *H03J 3/18* | (2006.01) | |
| *H03B 5/12* | (2006.01) | |
| *H03H 7/00* | (2006.01) | |
| *H03K 3/36* | (2006.01) | |

(52) U.S. Cl.
CPC ............. *H03J 3/185* (2013.01); *H03H 7/004* (2013.01); *H03K 3/36* (2013.01)

(58) Field of Classification Search
CPC ...... H03B 5/124–5/1253; H03B 5/1265; H03J 3/185; H03J 3/20
See application file for complete search history.

(56) References Cited

U.S. PATENT DOCUMENTS

| | | | |
|---|---|---|---|
| 5,214,682 A | 5/1993 | Clark | |
| 5,260,674 A | 11/1993 | Hulick | |
| 5,841,386 A | 11/1998 | Leduc | |
| 6,414,541 B1 * | 7/2002 | Arvidsson | ............ H03H 19/004 327/337 |
| 6,714,084 B2 | 3/2004 | Smith | |
| 6,885,328 B1 | 4/2005 | Kao et al. | |
| 7,081,583 B2 | 7/2006 | Greco et al. | |
| 7,336,134 B1 * | 2/2008 | Janesch | ................ H03L 7/0991 331/117 R |

(Continued)

OTHER PUBLICATIONS

Pokharel, Ramesh K., et al., "3.6 GHz Highly Monotonic Digitally Controlled Oscillator for All-Digital Phase Locked Loop", *2011 IEEE MTT-S International Microwave Symposium Digest (MTT)*, (4 pages total).

(Continued)

*Primary Examiner* — Dean Takaoka
*Assistant Examiner* — Alan Wong
(74) *Attorney, Agent, or Firm* — Leydig, Voit & Mayer, Ltd.

(57) ABSTRACT

An exponentially-scaling switched impedance circuit includes: two or more impedance scaling circuits, wherein each impedance scaling circuit comprises: an input port; an output port; and a switched impedance circuit connected in parallel to the output port. Each impedance scaling circuit is configured to provide an effective impedance at the input port corresponding to a scaled-down version of the exponentially-scaling switched impedance circuit. The two or more impedance scaling circuits are connected in a cascade such that an input of an impedance scaling circuit is connected to an output of a previous impedance scaling circuit and/or an output of the impedance scaling circuit is connected to an input of a next impedance scaling circuit.

13 Claims, 15 Drawing Sheets

(56) References Cited

U.S. PATENT DOCUMENTS

| | | | |
|---|---|---|---|
| 7,375,597 B2 | 5/2008 | Greenberg et al. | |
| 7,750,701 B2 | 7/2010 | Ainspan et al. | |
| 7,764,127 B2 | 7/2010 | Sun et al. | |
| 7,800,454 B2 | 9/2010 | Vanselow et al. | |
| 7,868,710 B1 | 1/2011 | Farahvash et al. | |
| 7,915,968 B2 | 3/2011 | Kim et al. | |
| 8,040,196 B2 | 10/2011 | Shin | |
| 8,299,862 B1 | 10/2012 | De Bernardinis et al. | |
| 8,319,563 B2 | 11/2012 | Mactaggart | |
| 9,118,335 B2* | 8/2015 | Wu | H03B 1/00 |
| 2003/0232602 A1 | 12/2003 | Akiya | |
| 2004/0183623 A1 | 9/2004 | Geller et al. | |
| 2008/0111641 A1 | 5/2008 | Huang et al. | |
| 2008/0129398 A1 | 6/2008 | Sun et al. | |
| 2008/0278249 A1* | 11/2008 | Hyvonen | H03B 5/1228 331/117 R |
| 2009/0153259 A1 | 6/2009 | Kim et al. | |
| 2009/0184749 A1 | 7/2009 | Hsieh | |
| 2011/0012657 A1 | 1/2011 | Hsieh et al. | |
| 2011/0234326 A1 | 9/2011 | Kobayashi | |
| 2013/0043958 A1 | 2/2013 | Chen et al. | |
| 2014/0085012 A1 | 3/2014 | Wu et al. | |
| 2014/0266518 A1* | 9/2014 | Wang | H03H 7/25 333/81 R |

OTHER PUBLICATIONS

Nakamura, Takahiro, et al., "A ΔΣ-Modulator-Less Digitally Controlled Oscillator using Fractional Capacitors for GSM/EDGE Transmitter", *2012 Proceedings of the ESSCIRC*, (ESSCIRC), (pp. 410-413).

Ito, H., et al., "A 1.7-GHz 1.5mW Digitally-Controlled FBAR Oscillator with 0.03-ppb Resolution", *ESSCIRC 2008, 34th European Soild State Circuits Conference*, (pp. 98-101).

Zheng, Shiyuan, et al., "A 4.1-to-6.5GHz Transformer-Coupled CMOS Quadrature Digitally-Controlled Oscillator with Quantization Noise Supression", *IEEE RFIC*, (May 2012), (pp. 519-522).

Kavala, Ani, et al., "A 5.6 GHz LC Digitally Controlled Oscillator with High Frequency Resolution Using Novel Quadruple Resolution Varactor", *2010 International SoC Design Conference (ISOCC)*, (pp. 279-282).

Yoo, Sang-Sun, et al., "A 5.8 GHz High Frequency Resolution Digitally Controlled Oscillator Using the Difference Between Inversion and Accumulation Mode Capacitance of pMOS Varactors", *IEEE Transaction on Microwave Theory and Techniques*, vol. 59, No. 2, pp. 375-382, (Feb. 2011).

Waffaoui, Rachid EI, et al., "A 5.8GHz LC-Based Digitally Controlled Oscillator with 20kHz Frequency Resolution and 37% turing Range", *Proceedings of ESSCIRC*, 2009 (4 pages total).

Yoo, Sang-Sun et al, "A 5.9 GHz LC-Based Digitally Controlled Oscillator with High Frequency Resolution Using Novel Varactor Pairs," *IEEE International Symposium on Radio-Frequency Integration Technology*, 2009. RFIT 2009, (pp. 195-198).

Hussein, Ahmed, I., et al., "A 10 mW 60GHz 65nm CMOS DCO with 24% Tuning Range and 40KHz Frequency Granularity", *Custom Integrated Circuits Conference (CICC), IEEE* (2015), (4 pages total).

Dalt, Nicola Da, et al., "A 10b 10GHz Digitally Controlled LC Oscillator in 65nm CMOS", *IEEE International Solid-State Circuits Conference, 2006, ISSCC 2006, Digest of Technical Papers*, (10 pages total).

Hung, Chao-Ching, et al., "A 35.56GHz All Digital Phase-Locked Loop with High Resolution Varactors", *Interntional Symposium on VLSI Design Automation and Test (VLSI-DAT)*, 2010 (pp. 245-248).

Genesi, Raffaella, et al, "A 53 GHz DCO for mm-Wave WPAN," *IEEE Custom Integrated Circuits Conference*, 2008. CICC, (pp. 571-574).

Pletcher, Natan M., et al., "A 100 μW, 1.9GHz Oscillator with Fully Digital Frequency Tuning", 2005 ESSCIRC, *Proceedings of the 31st European. Solid-State Circuits Conference*, Genoble, France, 2005, (pp. 387-390).

Chang, Yuyu, et al., "A Differential Digitally Controlled Crystal Oscillator with a 14-Bit Tuning Resolution and Since Wave Outputs for Cellular Application", *IEEE J. Solid-State Circuits*, vol. 47, No. 2, pp. 421-434, (Feb. 2012).

Staszewski, Robert Bogdan, et al., "A Digitally Controlled Oscillator in a 90 nm Digital CMOS Process for Mobile Phones", *IEEE J. Solid-State Circuits*, vol. 40, No. 11, pp. 2203-2211, (Nov. 2005).

Hung, Chih-Ming, et al., "A Digitally Controlled Oscillator System for SAW-Less Transmitters in Cellular Handsets", *IEEE J. Solid-State Circuits*, vol. 41, No. 5, pp. 1160-1170, (May 2006).

Ghidini, C., et al., "A Digitally Programmable On-Chip RC-Oscillator in 0.25μm CMOS Logic Process", *IEEE International Symposium on Circuits and Systems, ISCAS* (2005) (pp. 400-403).

Yang, Fan, et al., "A High Frequency Resolution Digitally Controlled Oscillator with Differential Tapped Inductor", *IEEE International Symposium on Circuits and Systems (ISCAS)*, (2015), (pp. 165-168).

Kodama, Kazutoshi, et al., "A High Frequency Resolution Digitally Controlled Oscillator Using Single-Period Switching Scheme", *2011 Proceedings of the ESSCIRC*, (2011), (pp. 399-402).

Chen, Pao-Lung, et al., "Portable Digitally Controlled Oscillator Using Novel Varactors", *IEEE Transations on Circuits and Systems-II, Express Briefs*, vol. 52, No. 5, pp. 233-237, (May 2005).

Pittorino, T., et al., "A UMTS-Complaint Fully Digitaly Controlled Oscillator wiht 100Mhz Fine-Tuning Range in 0.13μm CMOS", *IEEE International Solid State Curcuits Conference, ISSCC 2006, Digest of Technical Papers*, (10 pages total).

Hu, Julie, et al., "A Wide-Turning Digitally Controlled FBAR-Based Oscillator for Frequency Synthesis", *2010 IEEE International Frequency Control Symposium (FCS)* (pp. 608-612).

Fanori, Luca, et al., "Capacitive Degeneration in LC-Tank Oscillator for DCO Fine Frequency Tuning,", *IEEE J. Solid-State Circuits*, vol. 45, No. 12, pp. 2737-2745, (Dec. 2010).

Zhuang, Jingcheng, et al., "Design of Spur-Free ΣΔ Frequency Tuning Interfae for Digitally Controlled Oscillator", *IEEE Transactions on Circuits and Systems-II, Express Briefs*, vol. 62, No. 1, pp. 46-50, (Jan. 2015).

Staszewski, Robet Bodan, et al., "Digitally Controlled Oscillator (DCO)-Based Architecture for RF Frequency Synthesis in a Deep-Submicrometer CMOS Process", *IEEE Transaction on Circuits and Systems-II; Analog and Digital Signal Processing*, vol. 50, No. 11, pp. 815-828, (Nov. 2003).

Han, J.H., et al., "Digitally Controlled Oscillator with High Frequency Resolution Using Novel Varactor Bank", *IEEE Letters*, vol. 44, No. 25 (Dec. 2008), (2 pages total).

Park, Jeong-Ho, et al., "Effect of Capacitor Nonlinearity on the Oscillator Frequency of a Digitally-Controlled Oscillator using Oppsitely-Coupled PMOS Capacitor Pairs", *IEEE international Symposium on Circuits and Systems (ISCAS)*, (2012), (pp. 1147-1150).

Wu, Wanghua, et al., "High-Resolution Millimeter-Wave Digitally Controlled Oscillators wiht Reconfigureable Passive Resonators", *IEEE J. Solid-State Circuits*, vol. 48, No. 11, pp. 2785-2794, (Nov. 2013).

Pokharel, R.K., et al. "Low Phase Noise 18kHz Frequency Tuning Step 5 GHz DCO Using Tiny Capacitors Based on Transmissi, on Lines", *2010 Topical Meeting on Silicon Monolithic Integrated Circuits in RF System (SiRF)*, (pp. 8-11).

Fanori, Luca, et al., "3.3GHz DCO with a Frequency Resolution of 150Hz for All-Digital PPL", *2010 IEEE International Solid-State Circuits Conference*, (pp. 48-50).

Lee, Youngjae, et al., "Current Reuse Cross-Coupling CMOS VCO Using the Center-Tapped Transformer in LC Tank for Digitally Controlled Oscillator", *2008 IEEE Radio Frequency Integrated Circuits Symposium*, (pp. 549-552).

Wang, Zisong, et al., "A High-Resolution Tail-Capacitor Based Tuning Scheme for LC-DCO", *IEEE International Wireless Symposium (IWS)*, (2015).

State Intellectual Property Office of the P.R. China, International Search Report and the Written Opinion in International Application No. PCT/IB2017/053009 (dated Aug. 24, 2017).

* cited by examiner

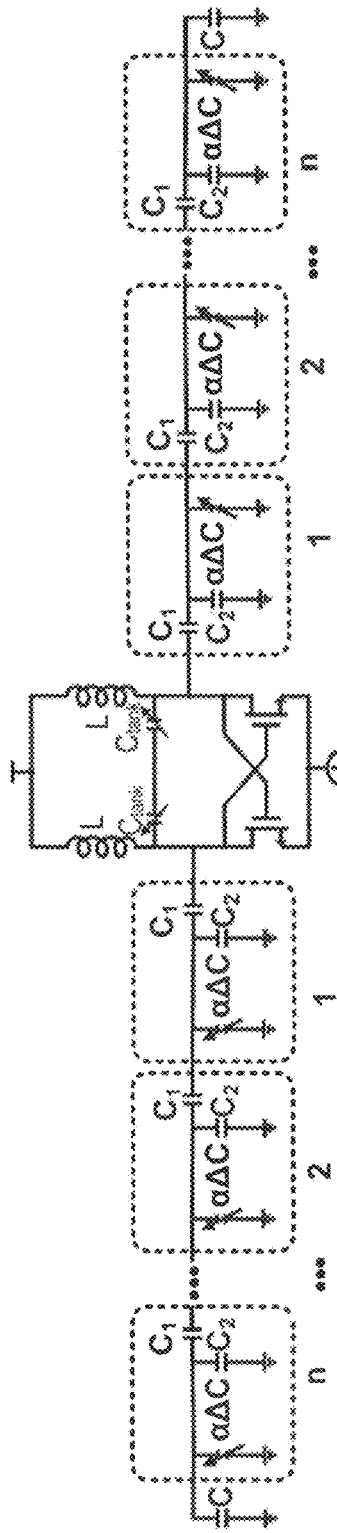
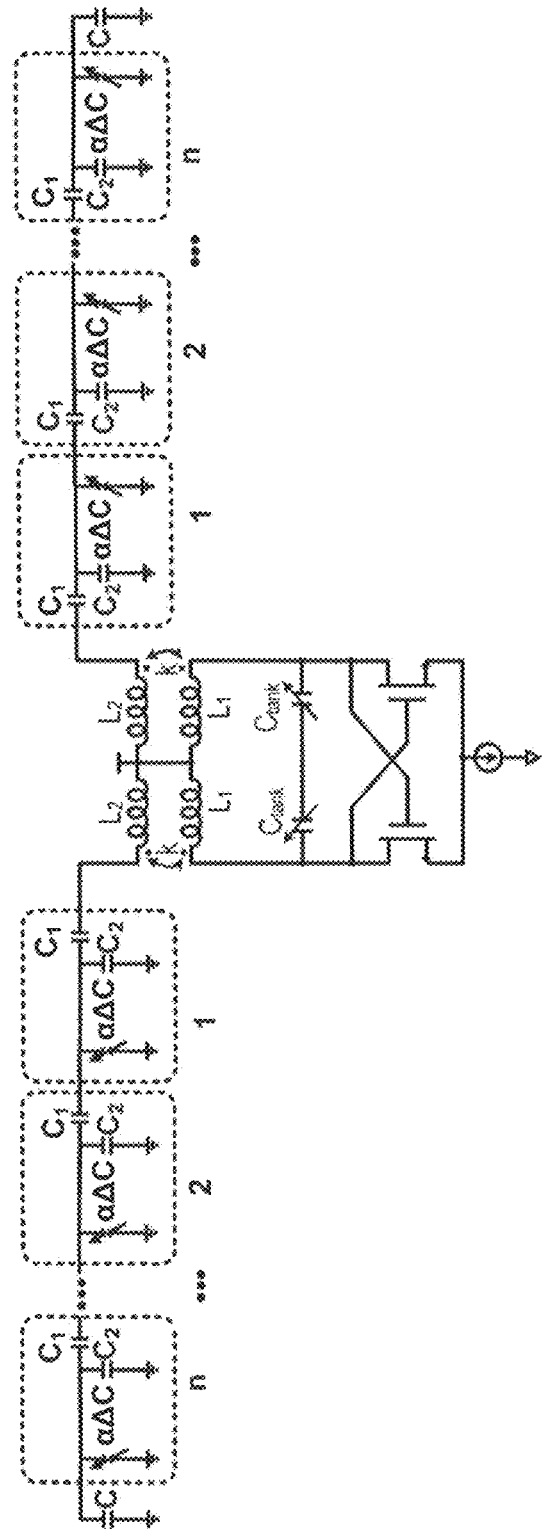
FIG. 8
FIG. 9

Performance Summary and Comparison of DCOs

|  | This Work | [Wu, JSCC' 13] | [Genesi, CICC'08] | [Fanori, ISSCC'10] |
|---|---|---|---|---|
| $f_0$ (GHz) | 54.79 - 63.16 | 56.33 - 62.16 | 51.3~53.3 | 3.0 |
| FTR (%) | 14.2 | 10 | 4 | 26 |
| Resolution (Hz) | 4 | 160K | 1.8M | 0.15K - 1.5K |
| PN@1MHz (dBc/Hz) | -90.7 - -94.1 | -90.5 - -92.5 | -116 @10MHz | -127.5 |
| Power (mW) | 18 | 12 | 2.34 | 16 |
| $FOM_T$* (dB) | -176.6 ~ -180 | -177.4 ~ -179.4 | -179.2 | -191 |
| Area (mm$^2$) | 0.1 | 0.16 | 0.09 | 0.32 |
| Process | CMOS 65nm | CMOS 90nm | CMOS 90nm | CMOS 65nm |

$$FOM_T = PN - 20\log\left(\frac{f_0}{\Delta f} \times \frac{FTR}{10\%}\right) + 10\log\left(\frac{Power}{1mW}\right)$$

FIG. 17

EXPONENTIALLY SCALING SWITCHED CAPACITOR

BACKGROUND

With aggressive scaling of complementary metal oxide semiconductor (CMOS) technologies, all-digital phase-locked loops (ADPLLs) have been widely explored due to their features of high re-configurability and on-chip integration of the loop filter. However, the limited frequency resolution of digitally-controlled oscillators (DCOs) becomes a bottleneck in achieving low out-band phase noise of ADPLLs. To achieve frequency resolution in the range of kilohertz (kHz) or even smaller, the minimum switched-capacitor needs to be smaller than atto-Farads (aF). The realization of such capacitors is limited by both lithography and matching. Attempts to scale down the effective capacitance of the switched-capacitor by using capacitive degeneration or transformer coupling are insufficient. Capacitive degeneration would require realizing a small trans-conductance, and transformer coupling would need a small coupling factor to achieve a high scaling factor for scaling down the effective capacitance of the switched-capacitor. Both a small trans-conductance and a small coupling factor are very sensitive to process, supply, and temperate (PVT) variations. Moreover, a high switched-capacitor scaling factor also reduces the fine tuning range of the switched-capacitor, which may cause frequency gaps in the DCO output.

Finally, as compared to radio frequency (RF) DCOs, a smaller tuning capacitor step is required to achieve comparable frequency resolution since mm-Wave DCOs become more sensitive to capacitor variation. As an example, even when using transformer coupling to shrink capacitor tuning step, mm-Wave ADPLLs still need sigma-delta modulators with dithering to further improve frequency resolution, which in turn would require a high clock frequency and large power to suppress out-of-band quantization phase noise.

SUMMARY

In an embodiment, the disclosure provides an exponentially-scaling switched impedance circuit. The exponentially-scaling switched impedance circuit comprises: two or more impedance scaling circuits, wherein each impedance scaling circuit comprises: an input port; an output port; and a switched impedance circuit connected in parallel to the output port; wherein each impedance scaling circuit is configured to provide an effective impedance at the input port corresponding to a scaled-down version of the exponentially-scaling switched impedance circuit; wherein an input of a first impedance scaling circuit forms an input for the exponentially-scaling switched impedance circuit, and an output of a last impedance scaling circuit forms the output of the exponentially-scaling switched impedance circuit, wherein the output of the exponentially-scaling switched impedance circuit is connected to a circuit or a component; and wherein the two or more impedance scaling circuits are connected in a cascade such that an input of an impedance scaling circuit is connected to an output of a previous impedance scaling circuit and/or an output of the impedance scaling circuit is connected to an input of a next impedance scaling circuit.

In another embodiment, the disclosure provides a system with an exponentially-scaling switched impedance circuit including two or more impedance scaling circuits. Each impedance scaling circuit includes an input port, an output port, and a switched impedance circuit connected in parallel to the output port, wherein an input of a first impedance scaling circuit forms an input for the exponentially-scaling switched impedance circuit, and an output of a last impedance scaling circuit forms the output of the exponentially-scaling switched impedance circuit. Also the output of the exponentially-scaling switched impedance circuit is connected to a circuit or a circuit component, and the two or more impedance scaling circuits are connected in a cascade such that an input of an impedance scaling circuit is connected to an output of a previous impedance scaling circuit and/or an output of the impedance scaling circuit is connected to an input of a next impedance scaling circuit. The system further includes a digitally-controlled oscillator (DCO) tank connected to the exponentially-scaling switched impedance circuit, and the DCO tank is configured to provide fine frequency tuning with the exponentially-scaling switched impedance circuit.

In yet another embodiment, the disclosure provides a system with an exponentially-scaling switched impedance circuit including two or more impedance scaling circuits. Each impedance scaling circuit includes an input port, an output port, and a switched impedance circuit connected in parallel to the output port, wherein an input of a first impedance scaling circuit forms an input for the exponentially-scaling switched impedance circuit, and an output of a last impedance scaling circuit forms the output of the exponentially-scaling switched impedance circuit. Also the output of the exponentially-scaling switched impedance circuit is connected to a circuit or a circuit component, and the two or more impedance scaling circuits are connected in a cascade such that an input of an impedance scaling circuit is connected to an output of a previous impedance scaling circuit and/or an output of the impedance scaling circuit is connected to an input of a next impedance scaling circuit. The system further includes a transformer, and a secondary coil of the transformer is connected to the exponentially-scaling switched impedance circuit. The transformer is configured to isolate the exponentially-scaling switched impedance circuit to reduce the loading of the exponentially-scaling switched impedance circuit.

In yet another embodiment, the disclosure provides a system with an exponentially-scaling switched impedance circuit including two or more impedance scaling circuits. Each impedance scaling circuit includes an input port, an output port, and a switched impedance circuit connected in parallel to the output port, wherein an input of a first impedance scaling circuit forms an input for the exponentially-scaling switched impedance circuit, and an output of a last impedance scaling circuit forms the output of the exponentially-scaling switched impedance circuit. Also the output of the exponentially-scaling switched impedance circuit is connected to a circuit or a circuit component, and the two or more impedance scaling circuits are connected in a cascade such that an input of an impedance scaling circuit is connected to an output of a previous impedance scaling circuit and/or an output of the impedance scaling circuit is connected to an input of a next impedance scaling circuit. The system further includes a cross-coupled pair, and a source node of the cross-coupled pair is connected to the exponentially-scaling switched impedance circuit. The cross-coupled pair is configured to isolate the exponentially-scaling switched impedance circuit to reduce loading of the exponentially-scaling switched impedance circuit.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 8 illustrates a DCO with an exponentially-scaling switched capacitor according to an embodiment of the disclosure;

FIG. 9 illustrates another DCO with an exponentially-scaling switched capacitor according to an embodiment of the disclosure;

FIG. 17 is a table providing various performance characteristics of the DCO in FIG. 12 compared to other DCOs;

DETAILED DESCRIPTION

DCOs are important building blocks in ADPLLs and frequency synthesizers, which can provide fully integrated frequency generation for all data and telecommunication communication systems.

Figures 1A, 1B:
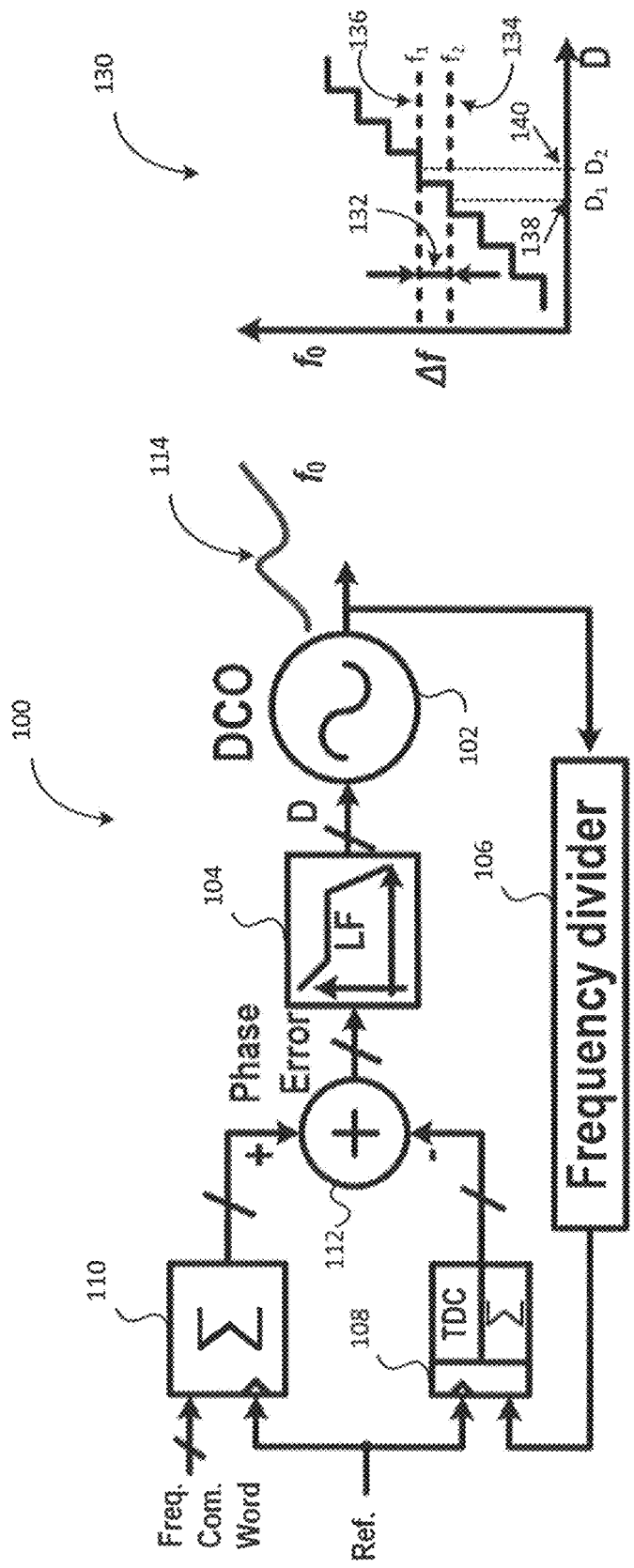
FIG. 1A illustrates an example of an ADPLL according to some embodiments of the disclosure.
FIG. 1B illustrates an example of a relationship between output frequency of the ADPLL and a digital control signal.

An example of an ADPLL or synthesizer is provided in FIG. 1A. In FIG. 1A, the ADPLL or synthesizer is locked by tuning the digital control word D in the DCO 102. However, due to the digital control granularity in the DCO, the DCO output frequency $f_0$ has a frequency gap $\Delta f$ between two adjacent tuning words as illustrated in FIG. 1B as item 132. When an output frequency is situated within the frequency tuning gap, for example, $\Delta f$, the ADPLL will dither the DCO frequency between these two adjacent tuning words ($D_1$ and $D_2$, represented as items 138 and 140, respectively). The frequency dithering will introduce quantization noise at the ADPLL output which may result in a signal resembling item 114 which has an unstable frequency between $f_1$ and $f_2$, represented by 136 and 134, respectively. In order to reduce the quantization noise, the tuning gap has to be small and the DCO should have a high frequency resolution.

Figure 2:
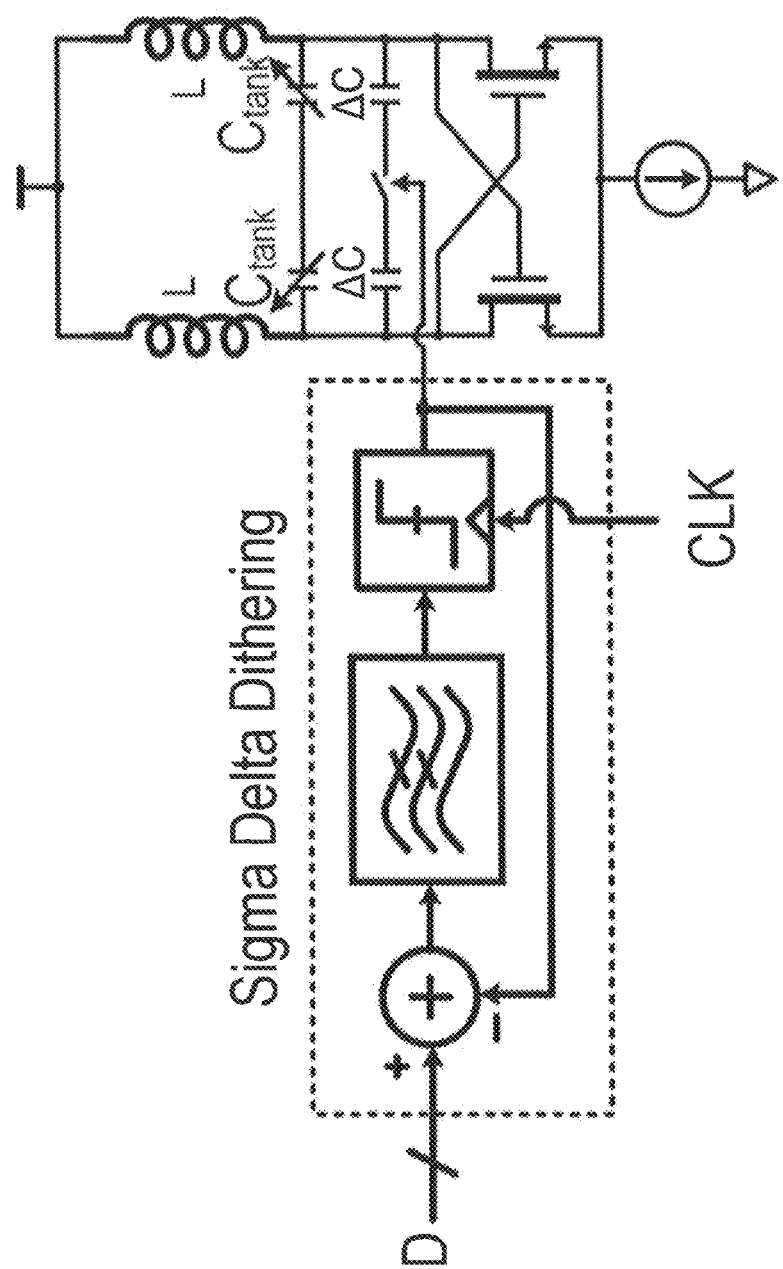
FIG. 2 illustrates using sigma delta dithering in a DCO embodiment.

One way to achieve high frequency resolution is using sigma-delta dithering as provided in FIG. 2. By exploiting the noise-shaping of sigma delta dithering and high over-sampling ratio, the quantization noise is shifted to a high frequency offset, thereby achieving a high frequency resolution. However, the sigma delta dithering 202 will introduce high quantization noise at high frequency offset and will degrade the ADPLL phase noise performance.

Figure 3B:
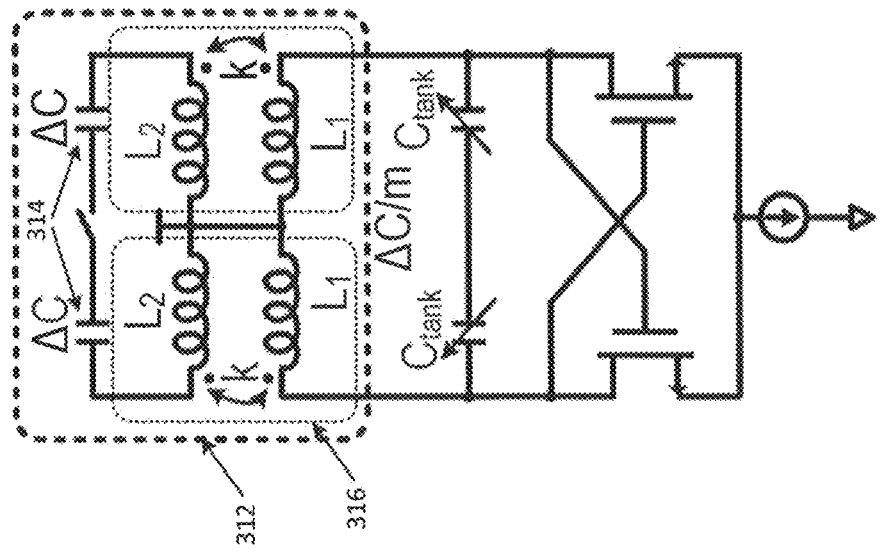
FIG. 3B illustrates the use of capacitive scaling using transformer coupling in a DCO embodiment.
Figure 3A:
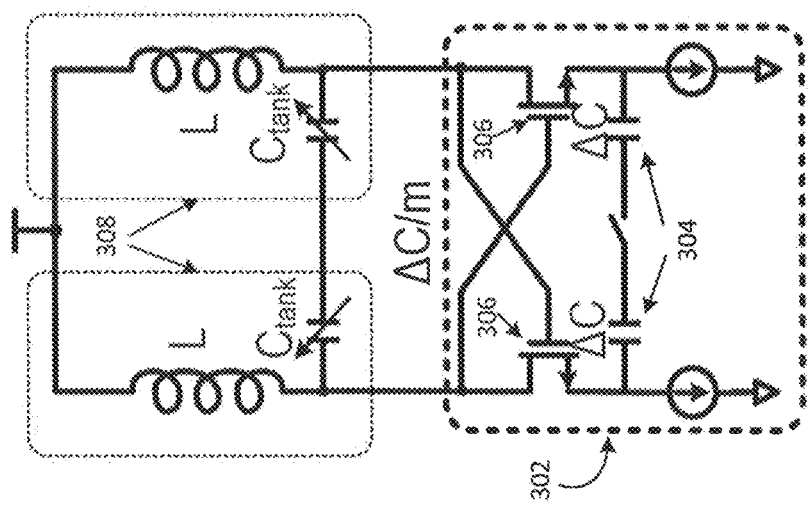
FIG. 3A illustrates the use of capacitive scaling in a DCO embodiment.

Another way to scale down tuning capacitance $\Delta C$ of the switched capacitor is by using a capacitance scaling circuit to transform a tuning capacitance. FIG. 3A provides an example where the switched capacitors 304 are connected to the source of the cross-coupled pair 306. An effective tuning capacitance $\Delta C/m$ is seen by the LC tank 308, because the cross-coupled pair 306 isolates the switched capacitor 304. With smaller trans-conductance of the cross-coupled pair 306, the scaling factor m is increased, thereby achieving a high frequency resolution. However, smaller trans-conductance becomes sensitive to PVT variation, which in turn limits the achievable scaling factor m. FIG. 3B shows a method of scaling down the capacitance $\Delta C$ of the switched capacitor by using transformer coupling. By connecting the switched capacitor 314 to the secondary coil of the transformer 316, the effective tuning capacitance can be reduced to $\Delta C/m$. To achieve a high scaling factor m, the coupling factor k of transformer has to be reduced, and the reduction of k is PVT sensitive thereby limiting the achievable scaling factor m.

Embodiments of the disclosure provide high frequency resolution in a DCO without using sigma-delta modulators. By using an exponentially-scaling switched-capacitor ladder capable of scaling down a capacitor tuning step exponentially with a number of stages, the embodiments are able to maintain a fine tuning range. In an exemplary implementation, embodiments of the invention provide a 60 GHz DCO with an exponentially-scaling C-2C switched-capacitor ladder which is capable of scaling down the capacitor tuning step exponentially with the number of stages while maintaining fine tuning range, and is able to achieve high frequency resolution without a sigma-delta modulator.

Figure 4:
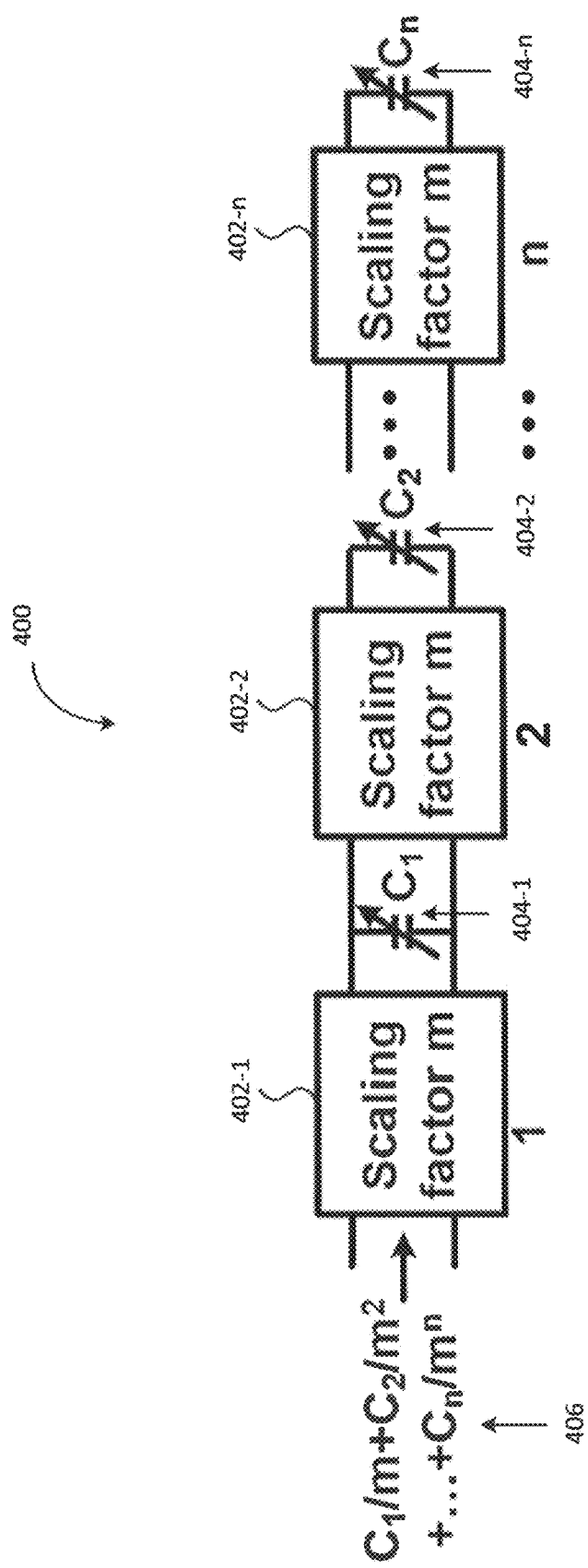
FIG. 4 illustrates a capacitive scaling circuit according to some embodiments of the disclosure.

Instead of only using a capacitance scaling circuit which only scales down the switched capacitor by a certain factor of m, embodiments of the present disclosure cascade many stages of a capacitance scaling circuit to achieve high resolution, as shown in the circuit architecture 400 of FIG. 4. In FIG. 4, the equivalent capacitance represented by item 406 will be a combination of the capacitors 404 and scaling factor 402 of each stage. By cascading with n stages, the circuit structure shown in FIG. 4 is able to scale down the switched capacitor by $m^n$ times. So the resolution will be enhanced exponentially with the number of stages n. Because each stage does not need to have a high scaling factor m, the exponentially-scaling switched capacitor will be more robust to PVT variation than a conventional capacitance scaling circuit. Another advantage is that the number of total switched-capacitor units utilized in the exponentially-scaling switched capacitor may be linearly proportional to the number of bits and resolution, while for a conventional capacitance scaling circuit the number of total switched-capacitor units increases exponentially to achieve an increase in bits and resolution. Thus, the exponentially scaling switched capacitor is able to achieve a large number of bits and resolution using a relatively smaller number of total switched-capacitor units and can realize a relatively more compact chip size. For example, in an exemplary embodiment involving a C-2C exponentially-scaling switched-capacitor ladder, 3 switched-capacitor units may provide an increase of 2 bits (so for 2*n bit control, 3*n switched-capacitor units may be used). In contrast, for a conventional capacitance scaling circuit, 2*n bit control would require 2^n switched-capacitor units.

Figure 5:
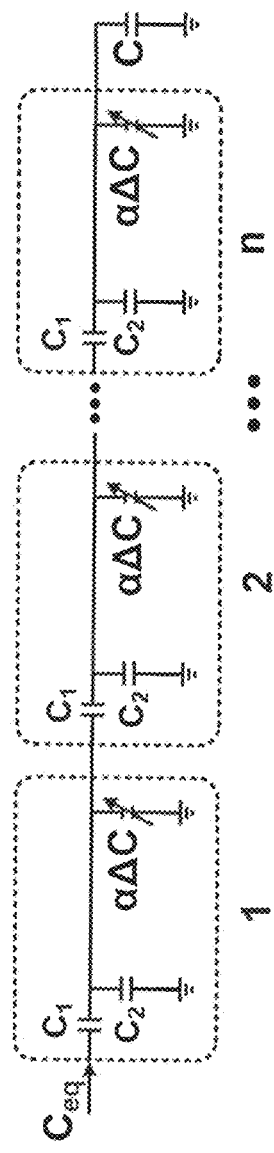
FIG. 5 illustrates an embodiment of a capacitive scaling circuit according to a first embodiment of the disclosure.
Figure 6:
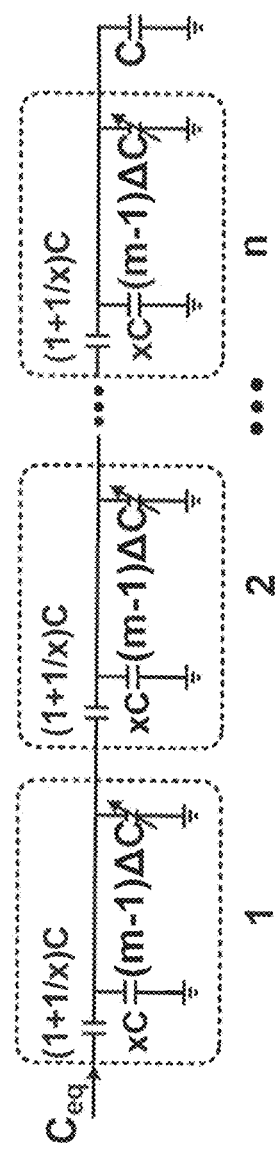
FIG. 6 illustrates an embodiment of a capacitive scaling circuit according to a second embodiment of the disclosure.
Figure 7:
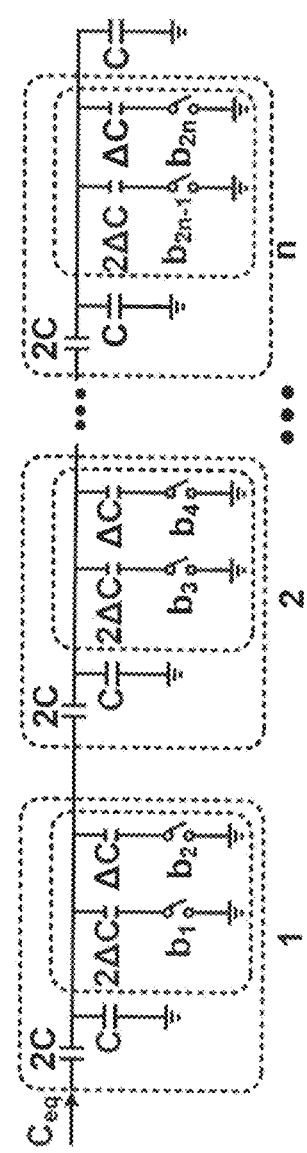
FIG. 7 illustrates an embodiment of a capacitive scaling circuit according to a third embodiment of the disclosure.

FIG. 5 shows one example of an exponentially-scaling switched capacitor by cascading n-stages of capacitive dividers. In each stage, there is a series capacitor $C_1$, a shunt capacitor $C_2$ and a switched capacitor $\alpha\Delta C$ for tuning. Each stage will scale down the tuning capacitor $\alpha\Delta C$ by $m_n$ times. Then the last stage tuning capacitor seen by the first stage input becomes $\alpha\Delta C/(m_1 m_2 \ldots m_n)$. FIGS. 6 and 7 will be explained with reference to the structure provided in FIG. 5.

FIG. 6 shows another example of an exponentially-scaling switched capacitor which has substantially the same input capacitance and scaling factor m for each stage. In order to make each stage have the same input capacitance and scaling factor, the $C_1$ of FIG. 5 should be sized as $(1+1/x)$ times C, and $C_2$ of FIG. 5 should be sized as x times C. The scaling factor m for each stage becomes $(1+x)^2$. With a different capacitor ratio x, a different scaling factor m may be provided. In order to have continuous tuning, the tuning capacitor in each stage may be chosen as $(m-1)\Delta C$. In order to change the tuning at each stage, the $(m-1)\Delta C$ capacitor may be a voltage controlled varactor with one terminal as an input and the other terminal as control.

FIG. 7 shows yet another example of an exponentially-scaling switched capacitor which has the same scaling factor for each stage. With x equal to 1, the series capacitor $C_1$ becomes 2C and shunt capacitor $C_2$ becomes C, then the scaling factor m for each stage becomes 4. The tuning capacitor in each stage may be chosen as $3\Delta C$ with 2-bit operation in each stage. The switches labeled as $b_x$ in FIG. 7 may be realized with transistors, wherein controlling the gate or base of a transistor closes or opens a $b_x$ switch, thereby changing the effective capacitance of a stage.

FIG. 8 shows one example of a DCO with an exponentially-scaling switched capacitor according to an embodiment of the disclosure. The exponentially-scaling switched capacitor is directly connected to a DCO tank for fine tuning the DCO's oscillation frequency.

FIG. 9 shows another example of a DCO with an exponentially-scaling switched capacitor according to an embodiment of the disclosure. The exponentially-scaling switched capacitor is connected to the secondary coil of transformer to further enhance the frequency resolution (i.e., by reducing the frequency tuning step) and reduce the loading of the exponentially-scaling switched capacitor, as the transformer coupling can isolate the capacitor at the secondary coil through the magnetic coupling of transformer. The coupling factor k of the transformer does not need to be as small as in the conventional approach to achieve high frequency resolution, but it may be designed to not be very large to avoid loading effects at the output of the DCO. For example, the coupling factor k may be 0.32.

Figure 10:
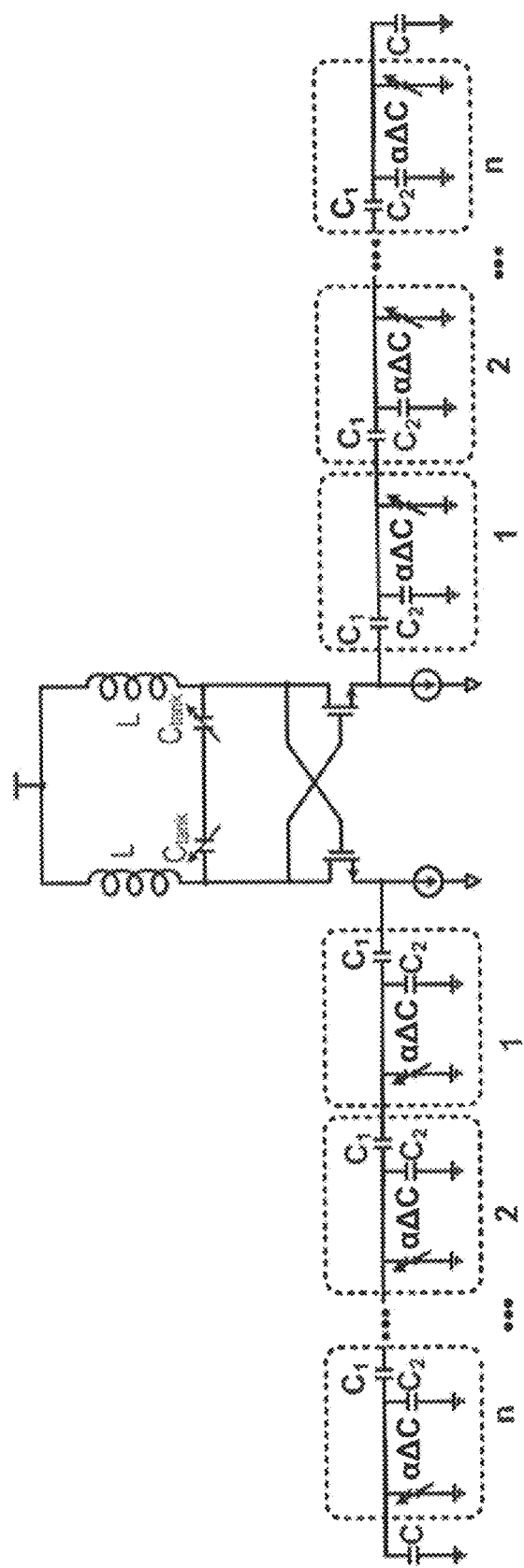
FIG. 10 illustrates yet another DCO with an exponentially-scaling switched capacitor according to an embodiment of the disclosure.

FIG. 10 shows yet another example of a DCO with an exponentially-scaling switched capacitor according to an embodiment of the disclosure. The DCO is similar to that of FIG. 8, but the exponentially-scaling switched capacitor is connected to the source node of the cross-coupled pair to further enhance the frequency resolution (i.e., by reducing the frequency tuning step) and reduce the loading of the exponentially-scaling switched capacitor. By not directly connecting the exponentially-scaling switched capacitor to the output node of the DCO as in FIG. 8, the cross-coupled pair of FIG. 10 can isolate the capacitor at the source node.

EXEMPLARY IMPLEMENTATION

Figure 11:
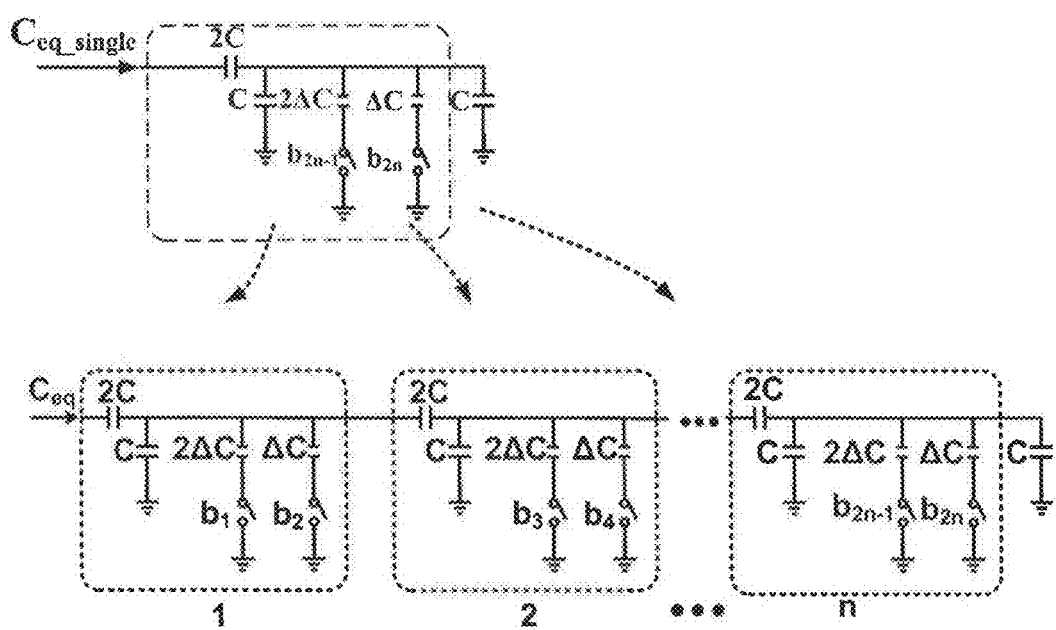
FIG. 11 illustrates a schematic of an exponentially-scaling C-2C switched-capacitor ladder.

FIG. 11 shows an exponentially-scaling C-2C switched-capacitor ladder according to an embodiment of the disclosure. The exponentially-scaling C-2C switched-capacitor ladder includes a C-2C capacitor ladder with a 2-bit switched-capacitor array (SCA) in each stage. As every stage of the C-2C capacitor ladder is identical with the same equivalent input capacitor C, the switched-capacitor ladder can be analyzed by single stage analysis and iterative analysis. As shown in FIG. 11, by using Taylor series expansion with assumption that $2b_{2n-1}\Delta C + b_{2n}\Delta C \ll C$, the equivalent input capacitor of each stage can be approximated as:

$$C_{eq\_single} = \frac{2C \cdot [2C + (2b_{n-1} + b_n)\Delta C]}{4C + (2b_{n-1} + b_n)\Delta C} \approx C + \frac{1}{4}(2b_{n-1} + b_n)\Delta C \quad (1)$$

Consequently, the switched capacitor is effectively scaled down by 4 times every stage. By cascading n identical switched-capacitor stages, the scaling factor becomes $(1/4)^n$. Finally, the equivalent capacitor of the C-2C switched ladder capacitor chain can be expanded as:

$$C_{eq} \approx C + \left[\frac{1}{2}b_1 + \left(\frac{1}{2}\right)^2 b_2 + \ldots + \left(\frac{1}{2}\right)^{2n} b_{2n}\right]\Delta C \quad (2)$$

Figure 12:
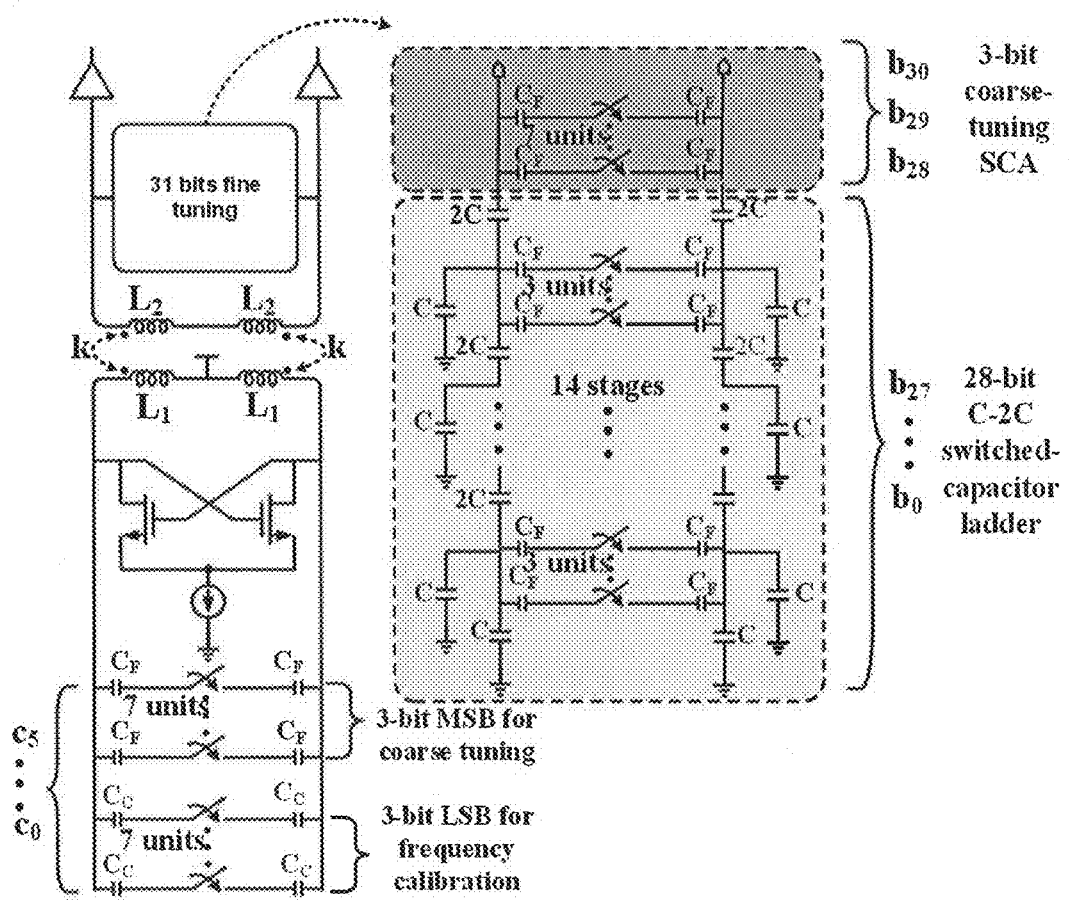
FIG. 12 illustrates a schematic of a DCO with the exponentially-scaling C-2C switched-capacitor ladder.

According to (1), in order to minimize the effect of the capacitor $\Delta C$ on the accuracy and the variation of the capacitor scaling factor, it is necessary that $\Delta C \ll c$. However, the effective input capacitor $C_{eq}$ of the C-2C switched-capacitor ladder would become large, which would degrade the oscillation frequency and the tuning range of the LC tank in a DCO circuit. As a result, the $(\Delta C/C)$ ratio is designed as the trade-off between the scaling factor variation and the loading effect of $C_{eq}$. In addition, transformer coupling is also used to reduce the loading effect of fine tuning to reduce frequency degradation although the transformer coupling also scales down the switched capacitor as shown in FIG. 12. Another 3-bit SCA is added in parallel to the C-2C switched-capacitor ladder to cover a coarse tuning step. In order to ensure continuous operation without any frequency gaps, the scaling factor may be designed to be, for example, 3.26, to ensure that the tuning range of the $n^{th}$ stage can cover the tuning step of the $(n-1)^{th}$ stage. Theoretically, as expected, according to (2), the frequency resolution can be further increased by increasing the number of stages at the expense of utilizing more chip area.

In order to achieve exponential scaling, a cascade of capacitive scaling circuits can be used. As shown in FIG. 11, the C-2C switched-capacitor ladder not only features identical input impedance for each stage but also consumes no power and occupies a small area. Unlike in conventional capacitive scaling circuits, for which the number of capacitors increases exponentially with the number of bits and resolution, exponentially-scaling switched capacitor circuits according to some embodiments of the disclosure only require a number of capacitors that is linearly proportional to the number of bits and resolution, which helps save chip area and simplify layout routing.

The C-2C exponentially-scaling switched-capacitor ladder is designed in an mm-Wave DCO for 60 GHz wireless communication as shown in FIG. 12. The switched capacitors of the DCO are divided into two parts: coarse tuning and fine tuning. Since the coarse tuning capacitor dominates the tank capacitor, its design is mainly based on the trade-off between the phase noise and tuning range. In some embodiments, the frequency tuning range may be designed to be 8.4 GHz in order to leave sufficient margins for process variations and inaccurate device modeling. In the example shown in FIG. 12, at the secondary coil, a 14-stage 28-bit C-2C switched-capacitor ladder is used for fine tuning and a 3-bit SCA is used for coarse tuning. At the primary coil, 3-bit MSB (most significant bit) control signals are used to divide the whole tuning range into 8 frequency bands for channel selection. In addition, 3-bit LSB (least significant bit) tuning capacitors are used for frequency calibration during ADPLL locking.

Figure 13:
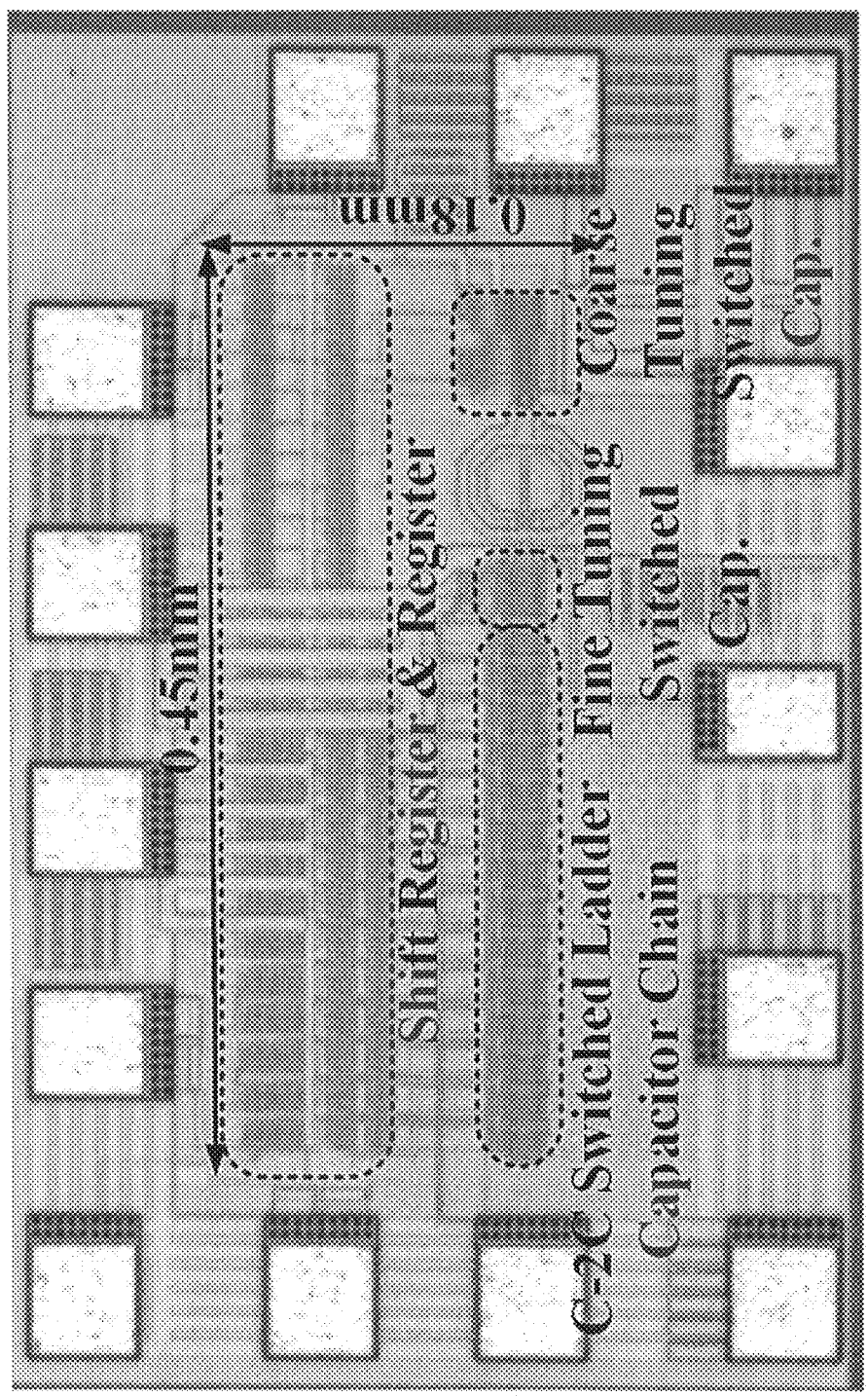
FIG. 13 shows a sample die photo of the DCO in FIG. 12.
Figure 14:
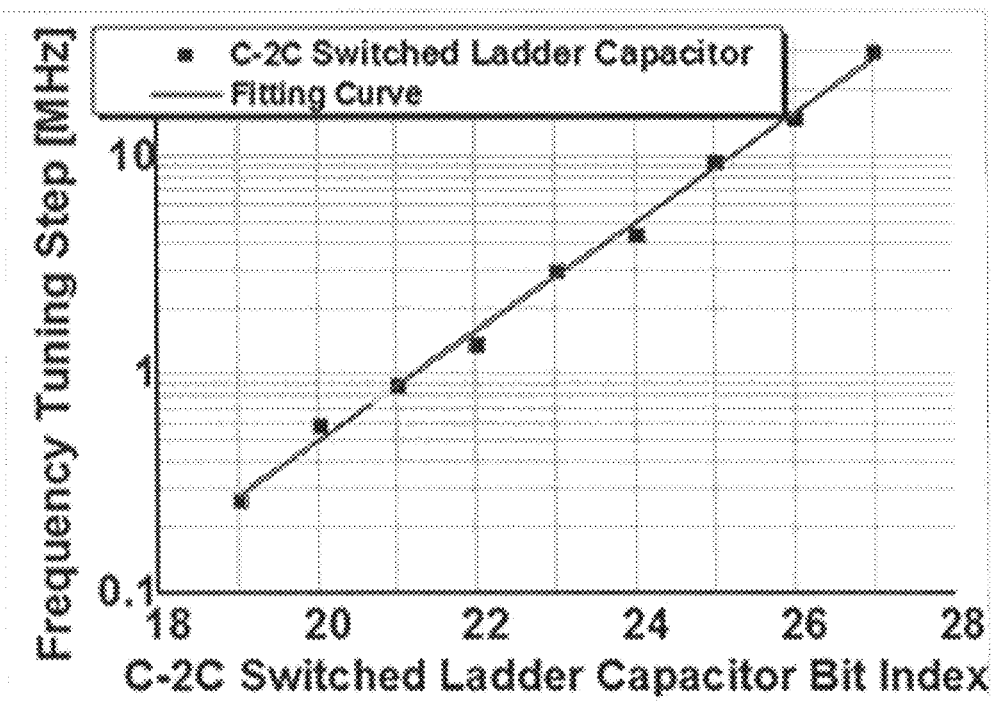
FIG. 14 is a graph of a measured frequency tuning step versus bit index of the C-2C switched-capacitor ladder of FIG. 11.

The DCO of FIG. 12 may be fabricated in a 65 nm CMOS process. FIG. 13 shows the die photo of the DCO with a core area of 0.1 mm$^2$, out of which only 0.012 mm$^2$ is for the 14-stage C-2C switched-capacitor ladder. FIG. 14 plots the measured frequency step versus bit index of the proposed C-2C switched-capacitor ladder. The lower bit index measurement is limited by the DCO frequency drift. With an average scaling factor per stage of 3.26, a 59-MHz tuning range of the 14-stage C-2C switched capacitor is achieved with an averaged resolution of 4 Hz. The fine tuning range is 0.38 GHz.

Figure 15:
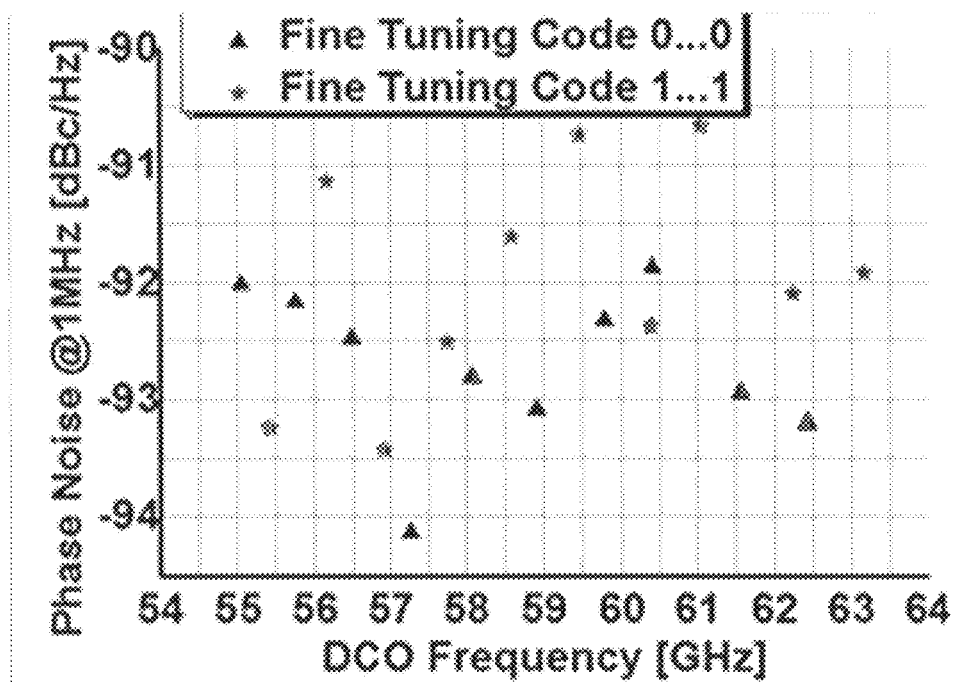
FIG. 15 is a graph of phase noise at 1 MHz offset versus frequency
Figure 16:
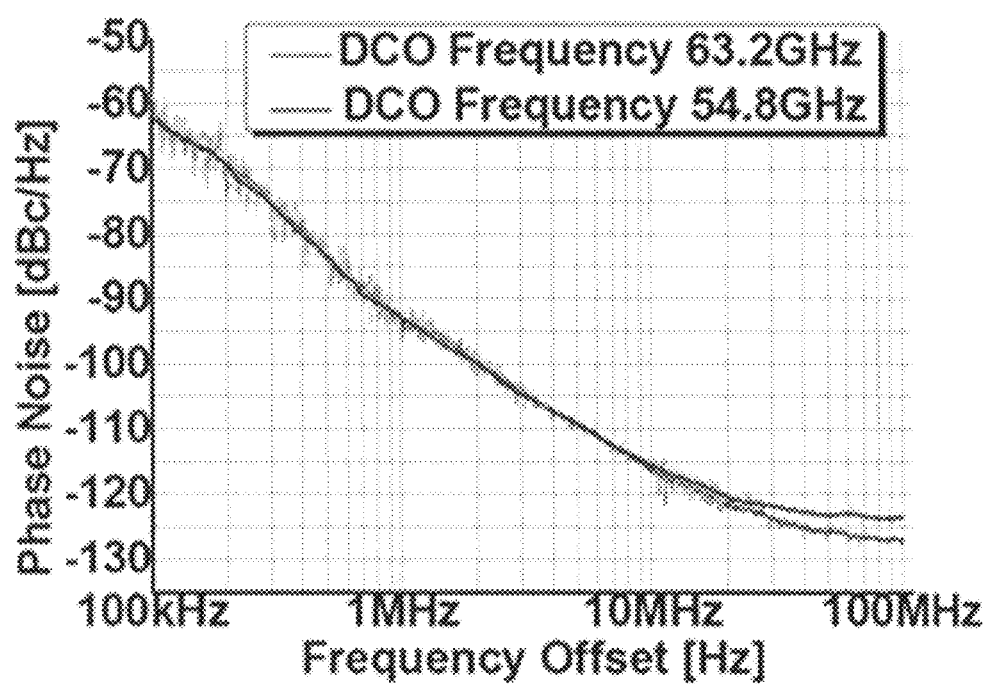
FIG. 16 is a graph of measured phase noise spectra at 54.8 GHz and 63.2 GHz.

FIG. 15 shows the measured phase noise ranging from −90.7 dBc/Hz to −94.1 dBc/Hz at 1 MHz offset over a measured oscillation frequency range from 54.79 GHz to 63.16 GHz. The DCO draws 15 mA current from a 1.2 V supply, resulting in a figure of merit (FOM$_T$) from −176.6 dBc/Hz to −180 dBc/Hz. FIG. 16 shows the measured phase noise spectrum. In FIG. 16, at 100 MHz frequency offset, when the DCO is providing 63.2 GHz, the phase noise is about −127 dBc/Hz. When the DCO is providing 54.8 GHz the phase noise is closer to −124 dBc/Hz.

FIG. 17 summarizes and compares the DCO's measured performance with existing DCOs. [Wu, JSCC' 13] corresponds to "High-Resolution Millimeter-Wave Digitally Controlled Oscillators with Reconfigurable Passive Resonators" by W. Wu et al. in *IEEE J. Solid-State Circuits*, vol. 48, pp. 2785-94, 2013. [Fanori, ISSCC' 10] corresponds to from "3.3 GHz DCO with a Frequency Resolution of 150 Hz for All-Digital PLL" by L. Fanori et al. in *ISSCC Dig. Tech. Papers*, pp. 48-49, 2010. [Genesi CICC' 08] corresponds to "A 53 GHz DCO for mm-wave WPAN" by R. Genesi et al. in *2008 IEEE Custom Integrated Circuits Conference*, pp. 571-574. With the exponentially-scaling C-2C switched-capacitor ladder discussed in the present disclosure, the DCO measures very high frequency resolution of 4 Hz, which is a few orders of magnitude better than any other design at much lower frequency, while occupying even smaller chip area and still achieving competitive performance in terms of power, phase noise, and FOM$_T$.

Figure 18:
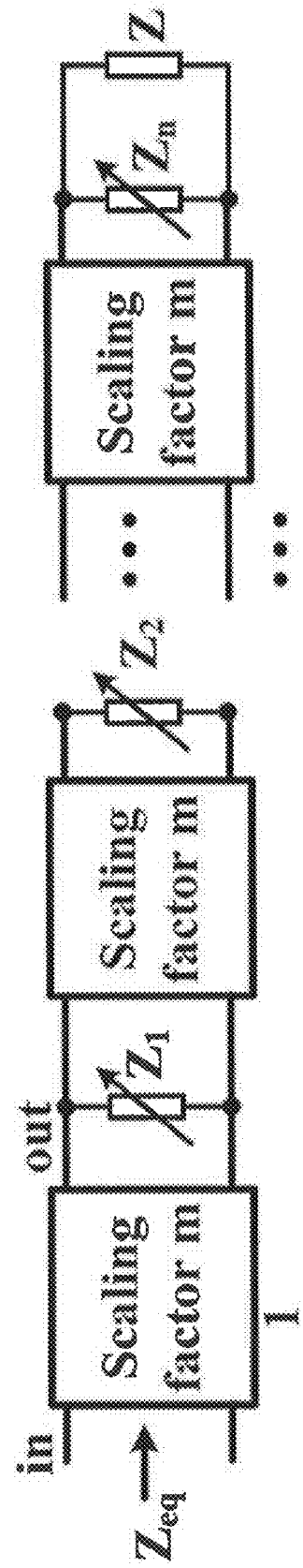
FIG. 18 is an architecture for an impedance scaling circuit according to some embodiments of the disclosure.

Embodiments of the disclosure are not limited to capacitive scaling but are also more generally applicable to impedance scaling. FIG. 18 shows multiple cascaded stages of an exponentially-scaling switched impedance scaling circuit. Each stage has an impedance scaling circuit that has an input port and an output port and a switched impedance circuit connected in parallel to the output port. By tuning the switched impedance circuit $Z_n$, the effective impedance tuning range and tuning step of switched impedance circuit $Z_n$ seen by the input port is scaled down by a scaling factor m in each stage. The input of a first stage is the input of the overall exponentially-scaling switched impedance scaling circuit. The output of the first stage is connected to the input of a second stage. The input of the last stage is connected to the output of second-to-last stage. The output of the last stage is connected to a circuit or a component that has a certain impedance. For the stages between the first stage and last stage, the respective inputs are connected to the outputs of the previous stage and the respective outputs are connected to the inputs of the next stage. Embodiments of the disclosure thus allow for the achievement of a very large high resolution with a small chip area and robustness to PVT variation.

Figure 19:
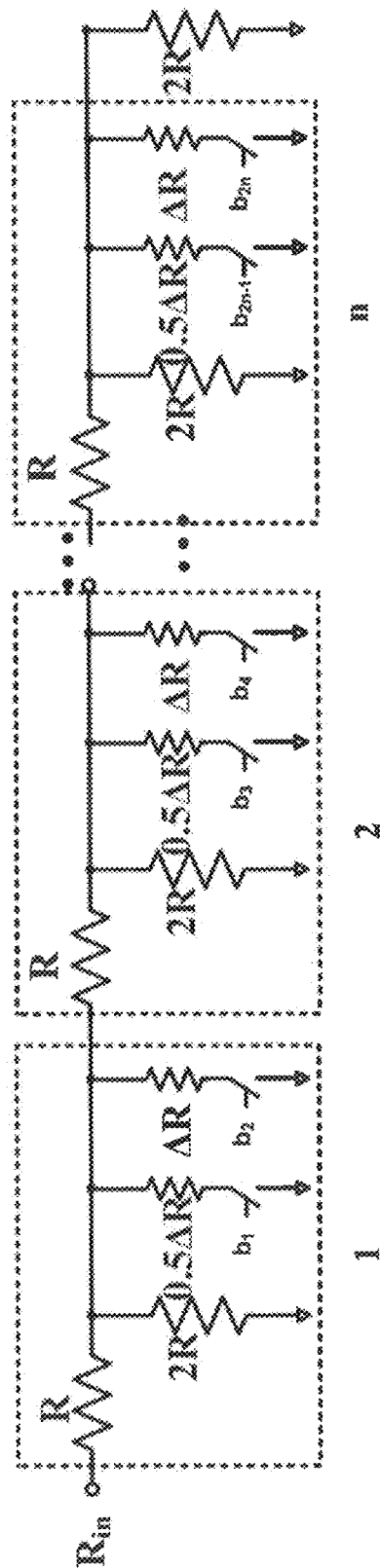
FIG. 19 illustrates a schematic of an exponentially-scaling 2R-R switched-resistor ladder according to some embodiments of the disclosure.

FIG. 19 illustrates another example of an exponentially-scaling switched impedance scaling circuit. Comparing FIG. 19 to FIG. 11, capacitors C are replaced with resistors 2R, capacitors 2C replaced with resistors R, capacitor 2ΔC replaced by resistor 0.5ΔR, and capacitor ΔC replaced by resistor ΔR. These values are chosen to realize a similar scaling factor and expression as that of FIG. 11, as such, the impedance variation ΔR will be scaled down by 4 times at each stage. The example in FIG. 11 used capacitors in an exponentially-scaling switched impedance scaling circuit, and the example in FIG. 19 used resistors in an exponentially-scaling switched impedance scaling circuit. Another embodiment may include the use of inductors in a configuration similar to that of FIGS. 1 and 19. Yet other embodiments may utilize combinations of circuit components. For example, combining capacitors and resistors; capacitors and inductors; inductors and resistors; and capacitors, resistors, and inductors.

In an embodiment, a switched impedance circuit is a switched capacitor circuit, where the switched capacitor circuit includes a capacitor in series with a transistor as a switch. By controlling the gate or base of the transistor, the capacitance of the switched capacitor circuit can be changed.

In an embodiment, a switched impedance circuit is a switched capacitor circuit, where the switched capacitor circuit includes a varactor with one terminal as input and another terminal as control. By changing the control voltage, the capacitance of the switched capacitor circuit can be changed.

In an embodiment, an impedance scaling circuit of the exponentially-scaling switched impedance scaling circuit includes two capacitors in series, where the input of the first capacitor is used as input of the impedance scaling circuit and the output of the first capacitor is used as output of the impedance scaling circuit, which is connected to a switched impedance circuit. The second capacitor is connected in parallel to the output of the impedance scaling circuit. In further embodiments, the switched impedance circuit is a switched capacitor circuit, where the switched capacitor circuit includes a capacitor in series with a transistor as a switch or a varactor with one terminal as input and another terminal as control. By controlling the gate or base of the transistor or by changing the control voltage for the varactor, the capacitance of the switched capacitor circuit can be changed. In yet another further embodiment, for each stage, the value of the first capacitor is two times the capacitance of the circuit or component which is connected to the output of the last stage, and the value of second capacitor is the same as the capacitance of the circuit or component which is connected to the output of last stage. Still further, the switched impedance circuit may be a 2-bit switched-capacitor array.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. An exponentially-scaling switched impedance circuit, comprising:
   two or more impedance scaling circuits, wherein each impedance scaling circuit comprises:
      an input port;
      an output port; and
      a switched impedance circuit connected in parallel to the output port;
   wherein each impedance scaling circuit is configured to provide an effective impedance at the input port corresponding to a scaled-down version of the exponentially-scaling switched impedance circuit;
   wherein an input of a first impedance scaling circuit forms an input for the exponentially-scaling switched impedance circuit, and an output of a last impedance scaling circuit forms an output of the exponentially-scaling switched impedance circuit, wherein the output of the exponentially-scaling switched impedance circuit is connected to a circuit or a component; and
   wherein the two or more impedance scaling circuits are connected in a cascade such that an input of an impedance scaling circuit is connected to an output of a previous impedance scaling circuit and/or an output of the impedance scaling circuit is connected to an input of a next impedance scaling circuit.

2. The exponentially-scaling switched impedance circuit according to claim 1, wherein the switched impedance circuit is a switched capacitor circuit, the switched capacitor circuit comprising a capacitor in series with a transistor as a switch, wherein controlling a gate or a base of the transistor changes the capacitance of the switched capacitor circuit.

3. The exponentially-scaling switched impedance circuit according to claim 1, wherein the switched impedance circuit is a switched capacitor circuit, the switched capacitor circuit comprising a varactor with one terminal as input and another terminal as control, wherein changing a control voltage changes the capacitance of the switched capacitor circuit.

4. The exponentially-scaling switched impedance circuit according to claim 1, wherein an impedance scaling circuit of the two or more impedance scaling circuits comprises:
   a first capacitor connected in series with a second capacitor, wherein the input of the first capacitor corresponds to an input of the impedance scaling circuit and an output of the first capacitor corresponds to an output of the impedance scaling circuit, wherein the output of the impedance scaling circuit is connected to a switched impedance circuit of the impedance scaling circuit, and wherein the second capacitor is connected in parallel to the output of the impedance scaling circuit.

5. The exponentially-scaling switched impedance circuit according to claim 4, wherein the switched impedance circuit is a switched capacitor circuit, the switched capacitor circuit comprising a capacitor in series with a transistor as a switch, wherein controlling a gate or a base of the transistor changes the capacitance of the switched capacitor circuit.

6. The exponentially-scaling switched impedance circuit according to claim 4, wherein the switched impedance circuit is a switched capacitor circuit, the switched capacitor circuit comprising a varactor with one terminal as input and another terminal as control, wherein changing a control voltage changes the capacitance of the switched capacitor circuit.

7. The exponentially-scaling switched impedance circuit according to claim 4, wherein the first capacitor has a capacitance that is two times a capacitance of the circuit or component connected to the output of the exponentially-scaling switched impedance circuit, and the second capacitor has a capacitance that is the same as the capacitance of the circuit or component connected to the output of the exponentially-scaling switched impedance circuit.

8. The exponentially-scaling switched impedance circuit according to claim 7, wherein the switched impedance circuit is a switched capacitor circuit with two-bit operation.

9. The exponentially-scaling switched impedance circuit according to claim 1, wherein an impedance scaling circuit of the two or more impedance scaling circuits comprises:
   a first resistor connected in series with a second resistor, wherein the input of the first resistor corresponds to an input of the impedance scaling circuit and an output of the first resistor corresponds to an output of the impedance scaling circuit, wherein the output of the impedance scaling circuit is connected to a switched impedance circuit of the impedance scaling circuit, and wherein the second resistor is connected in parallel to the output of the impedance scaling circuit.

10. The exponentially-scaling switched impedance circuit according to claim 9, wherein the switched impedance circuit is a switched resistor circuit with two-bit operation.

11. A system, comprising:
an exponentially-scaling switched impedance circuit, comprising two or more impedance scaling circuits, wherein each impedance scaling circuit comprises an input port, an output port, and a switched impedance circuit connected in parallel to the output port, wherein an input of a first impedance scaling circuit forms an input for the exponentially-scaling switched impedance circuit, and an output of a last impedance scaling circuit forms an output of the exponentially-scaling switched impedance circuit, wherein the output of the exponentially-scaling switched impedance circuit is connected to a circuit or a component, and wherein the two or more impedance scaling circuits are connected in a cascade such that an input of an impedance scaling circuit is connected to an output of a previous impedance scaling circuit and/or an output of the impedance scaling circuit is connected to an input of a next impedance scaling circuit; and
a digitally-controlled oscillator (DCO) tank connected to the exponentially-scaling switched impedance circuit, the DCO tank being configured to provide fine frequency tuning with the exponentially-scaling switched impedance circuit.

12. A system, comprising:
an exponentially-scaling switched impedance circuit, comprising two or more impedance scaling circuits, wherein each impedance scaling circuit comprises an input port, an output port, and a switched impedance circuit connected in parallel to the output port, wherein an input of a first impedance scaling circuit forms an input for the exponentially-scaling switched impedance circuit, and an output of a last impedance scaling circuit forms an output of the exponentially-scaling switched impedance circuit, wherein the output of the exponentially-scaling switched impedance circuit is connected to a circuit or a circuit component, and wherein the two or more impedance scaling circuits are connected in a cascade such that an input of an impedance scaling circuit is connected to an output of a previous impedance scaling circuit and/or an output of the impedance scaling circuit is connected to an input of a next impedance scaling circuit; and
a transformer, wherein a secondary coil of the transformer is connected to the exponentially-scaling switched impedance circuit, the transformer being configured to isolate the exponentially-scaling switched impedance circuit to reduce the loading of the exponentially-scaling switched impedance circuit.

13. A system, comprising:
an exponentially-scaling switched impedance circuit, comprising two or more impedance scaling circuits, wherein each impedance scaling circuit comprises an input port, an output port, and a switched impedance circuit connected in parallel to the output port, wherein an input of a first impedance scaling circuit forms an input for the exponentially-scaling switched impedance circuit, and an output of a last impedance scaling circuit forms an output of the exponentially-scaling switched impedance circuit, wherein the output of the exponentially-scaling switched impedance circuit is connected to a circuit or a circuit component, and wherein the two or more impedance scaling circuits are connected in a cascade such that an input of an impedance scaling circuit is connected to an output of a previous impedance scaling circuit and/or an output of the impedance scaling circuit is connected to an input of a next impedance scaling circuit; and
a cross-coupled pair, wherein a source node of the cross-coupled pair is connected to the exponentially-scaling switched impedance circuit, the cross-coupled pair being configured to isolate the exponentially-scaling switched impedance circuit to reduce loading of the exponentially-scaling switched impedance circuit.

* * * * *